Figure 1:
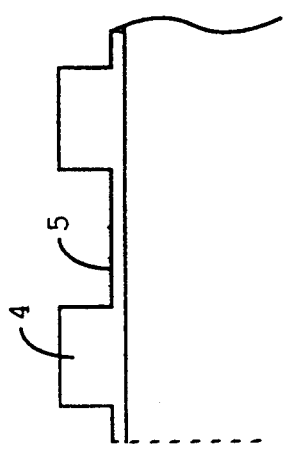
Figure 1:
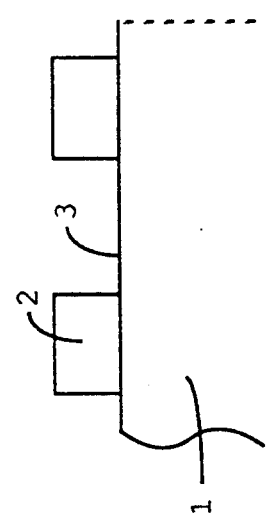

United States Patent [19]

Tissier et al.

[11] Patent Number: 5,043,236

[45] Date of Patent: Aug. 27, 1991

[54] PROCESS FOR DETERMINING THE FOCUSSING OF A PHOTOLITHOGRAPHIC APPARATUS

[75] Inventors: Annie Tissier, Saint-Ismier; Bruno Latombe; Alain Poncet, both of Saint-Martin-D'Heres, all of France

[73] Assignee: Etat Francais représenté par le Ministre des Postes, Télécommunications et de l'Espace, Issy-Les-Moulineaux, France

[21] Appl. No.: 456,802

[22] Filed: Dec. 29, 1989

[30] Foreign Application Priority Data

Dec. 30, 1988 [FR] France ................................ 88 17615

[51] Int. Cl.$^5$ ............................................... G03C 5/00
[52] U.S. Cl. ...................................... 430/30; 430/311; 430/330
[58] Field of Search ............................ 430/30, 311, 330

[56] References Cited

U.S. PATENT DOCUMENTS 4,774,158  3/1981  Veavoordeldonic ................. 430/30

FOREIGN PATENT DOCUMENTS 0217463  3/1978  European Pat. Off. ............. 430/30

OTHER PUBLICATIONS

Dill et al. Thermal Effects on the Photoresist AZ1350J, pp. 210–218, IBM Journal of Research Development vol. 21, No. 3, 5/1977.

Kiyokatsu Jinno et al., "Baking Characteristics of Positive Photoresists" *Photographic Science and Engineering*, vol. 21, No. 5, Sep./Oct. 1977, pp. 290–292.

*Primary Examiner*—Charles L. Bowers, Jr.
*Assistant Examiner*—Thomas R. Neville
*Attorney, Agent, or Firm*—Lowe, Price, Leblanc and Becker

[57] ABSTRACT

In a process for determining the focussing of a photolithographic apparatus on a resist-coated wafer, comprising the following steps: 1) insolating, successively in various places, the resist by a test pattern, a different focussing being carried out for each insolation; 2) developing the resist; 3) observing the wafer for determing the optimal insolation and adopting the corresponding setting for the apparatus, it is provided, between steps 2) and 3), the step consisting in heating the wafer up to a temperature higher than the vitreous transition temperature of the resist.

10 Claims, 1 Drawing Sheet

PROCESS FOR DETERMINING THE FOCUSSING OF A PHOTOLITHOGRAPHIC APPARATUS

BACKGROUND OF THE INVENTION

The present invention relates to apparatuses for manufacturing semiconductors and more particularly to photolithography apparatuses.

In the field of semiconductor manufacturing, photoetching steps are used at numerous manufacturing steps.

A photoetching step conventionally comprises the following steps:

depositing on a substrate the thin layer that is desired to etch in order to leave some portions in place, depositing on this thin layer a photosensitive masking layer, usually called resist, insolating the resist according to the determined pattern, developing the resist for leaving in place the insolated portions (positive resist) or the non-insolated portions (negative resist), and etching the thin layer at the places non-covered by the resist.

Also, in the field of semiconductors, numerous processes have been developed for etching thin layers. Among those processes, can be cited: wet etching processes (in an etching bath) and dry etching processes (in pre-sence of a plasma) as well as anisotropic and isotropic etching processes.

Whatever the etching process may be, one of the key steps of this process is the insolation of the resist layer, that can be carried out by means of various known apparatuses, for example a photorepeater. Indeed, if the mask image that is desired to be formed on the resist layer is not properly focussed (too short focussing) or if the insolation dose is insufficient, the photoresist is liable to be underexposed which will cause it to remain partially in place after development in areas from which it should have been removed from. Conversely, if insolation is excessive, or if the depth of focussing is too high, the resist will be overexposed and, during the resist development phase, the sizes will be higher or lower (positive or negative resist) than the desired sizes. In the modern technologies where it is desired to define lines having a width of about one micrometer, this focussing step is particularly critical and variations in temperature or hygrometry of the room where the apparatus is located may cause modifications of the setting of said apparatus. Therefore, the apparatus has to be periodically reset, usually at least once a day, in an assembly line.

Conventionally, in order to carry out this setting, a same test pattern is imaged onto a test wafer, in a repetitive and successive way in various places of the wafer, corresponding for example to the various positions of the chips it is desired to form on the wafer during the normal manufacturing process. For each place where the pattern is imaged, focussing of the exposure machine is liable to vary by a very low value with respect to the average value. Then, after development of the resist, each of the patterns is observed by means of a high-power (500–1000) microscope for selecting the one that corresponds to the optimal resolution, that is, the first pattern wherein the resist is completely removed at the desired places without overetching the resist. This operation is delicate for the operator because the focussing depth of the microscope is lower than the depth of the resist (for example of about one micrometer for the whole layer depth) and, on the other hand, it is inaccurate since it depends upon the interpretation that can be made by the operator. Of course, it is possible to improve the accuracy by using a scanning electron microscope but this involves an increase in measurement time and cost.

SUMMARY OF THE INVENTION

Thus, an object of the invention is to provide for a process permitting to facilitate this focussing step and moreover to allow it to be easily carried out in an automatic way.

This object is achieved by allowing the resist test pattern of the prior art process hereinabove described to flow by heating it above its vitreous transition point after development and before measurement. As a result, as will be seen later on, the contrast is substantially increased in case the resist has been completely eliminated at the desired places in comparison with the case it remains at least partially at those places.

BRIEF DISCLOSURE OF THE DRAWINGS

Figure 2:
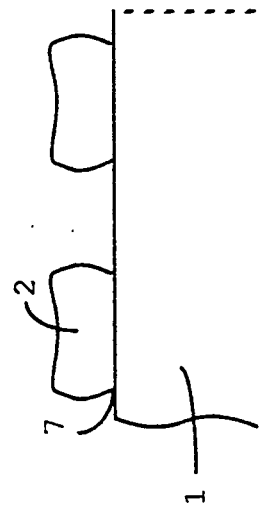

The foregoing and other objects. features and advantages of the invention will be apparent from the following detailed description of a preferred embodiment as illustrated in the accompanying drawings wherein:

FIG. 1 shows a wafer coated with a resist layer, insulated by test patterns after development of the resist; and FIG. 2 shows the wafer after a flowing step has been carried out according to the invention. DETAILED DESCRIPTION OF THE INVENTION FIG. 1 shows an exemplary resist layer, for example a novolak polymer layer, formed on a substrate 1, for example a silicon substrate. The resist layer has been processed according to the conventional test pattern exposure, for example in the form of a stripe, and development. The left portion of the figure shows a section view of a region corresponding to an optimal insolation wherein remain some resist stripes 2 between which appears the surface 3 of the silicon substrate. On the right portion of the figure, the resist has been underinsolated and there are regions where a thin resist layer 5 remains between resist stripes 4. This layer 5 is liable to exhibit an uneven depth and let the surface of the silicon substrate be partially apparent. To give some orders of magnitude, the resist layer thickness at the stripes may be of about one micrometer, and the stripes are liable to be realized at a 1 to 3-micrometer pitch. The thickness of layer 5 is extremely low since it results from the last setting close to the optimal setting. Consequently, as previously indicated, layer 5 is hardly visible by an observer and, due to its very low thickness with respect to an optical wavelenght, its presence or absence is difficult to detect through reflectometry means.

Thus, as shown in FIG. 2, the process according to the invention provides for submitting the wafer to a thermal step at a temperature higher than the flowing temperature (or vitreous transition temperature) of the resist used, for example for a Kodak resist KTI 820, a temperature of about 100–110° for a few tens seconds. Then, it is noted, in case the resist has been completely eliminated between stripes 2, that the shape of those stripes are deformed but there exists an anchoring point (or line) 7 at the resist-substrate interface and the resist does not tend to flow from one stripe to another. This is represented on the lefthand portion of FIG. 2. However, as shown on the righthand portion of FIG. 2, as soon as there is a thin resist layer 5 between stripes 4, flowing causes the intermediate region to be filled up until it forms a substantially curved profile in accordance with the time duration and temperature of the annealing process.

Thus, as will be understood by those skilled in the art, after this flowing step, differentiation between the case shown on the left portion of the figure and that illustrated on the right portion becomes very easy. It will be for example possible to use a medium-power (100-200) optic microscope; the focussing region is determined as being the first of the regions comprising very visible contact holes or stripes whereas the contact holes or stripes have disappeared over all the underinsolated areas.

More automatically, an optic reflectometry process can be carried out, which will then permit to provide for a fully automatic setting. A structure such as the one shown on the left portion of FIG. 2 exhibits an overall reflectivity coefficient (it is to be understood that numerous parallel stripes are provided for in the pattern) with respect to the pattern shown on the left portion of FIG. 2. For example, in the case of a silicon substrate as hereinabove mentioned, the reflectivity of bare silicon is substantially higher than that of resist-coated silicon. The luminous intensity will therefore be much higher in the case shown in the lefthand portion of the figure than in the case shown in the righthand portion.

It will be noted that the process according to the invention is particularly simple, does not require any expensive equipment and does not take much time. Indeed, as indicated in the previous example, the annealing process can be carried out for a very short time duration (a few tens seconds only) and gives a satisfactory result. On the other hand, the annealing temperature is not critical.

Of course, the invention is liable of numerous variants which will clearly appear to those skilled in the art. In the example given hereinabove, the silicon wafer is coated with a resist layer. It is possible to use another substrate adapted to the process it is desired to implement in active manufacturing. For example, the substrate could comprise an upper layer made of silicon oxide, metal, silicon nitride, metal polysilicide, etc.

On the other hand, in the above example, the process was implemented on a test wafer. This process could also be implemented on a real wafer chosen among a wafer batch to be processed.

We claim:

1. A process for determining the focussing of a photolithographic apparatus on a resist-coated layer, comprising the following steps:
    insolating the resist by a test pattern, successively in various places, a different focussing being carried out for each insolation,
    developing the resist,
    heating the wafer up to a temperature higher than the vitreous transition temperature of the resist, and
    observing the wafer for determining the optimal insolation and adopting the corresponding setting for the apparatus.

2. A process according to claim 1 wherein the observation step is carried out through optical reflectometry.

3. A process according to claim 1 wherein the various focussing step correspond to incremental settings of the focussing with respect to an average setting.

4. A process according to claim 1 wherein the resist is a novolac resist.

5. In a process of manufacturing a semiconductor including a photoetching procedure for a resist layer including application of an insolation dose thereto, the improvement comprising:
    a method for determining whether the insolation dose applied to the resist layer is sufficient, comprising the steps of
    insolating the resist layer at a plurality of locations by a test pattern, each location being insolated at a different focussing setting;
    heating the resist layer above a vitreous transition point thereof in order to cause the resist layer to flow and to increase a thickness of a thin remanent layer of resist between image portions formed on the resist layer;
    visually identifying a region icluding visible contact holes free of the flowed resist material of increased thickness; and
    determining that a sufficient insolation dose is applied at the region having said visible contact holes free of the resist material.

6. In a process of manufacturing a semiconductor including a photoetching procedure for a resist layer including application of an insolation dose thereto wherein a mask image is focussed on the resist layer, the improvement comprising:
    a method for identifying accurate focussing of the image on the resist layer, comprising the steps of
    insolating the resist layer at a plurality of regions by a test pattern, each region being insolated at a different focussing setting;
    developing the mask image;
    heating the resist layer above a vitreous transition point thereof in order to cause the mask image developed in the resist layer to flow and to increase a thickness of any thin layer of resist remaining between portions of the mask image developed on the resist layer;
    optically identifying a region including visible contact holes free of the thickened resist material; and
    determining that the image is accurately focussed at the region having said visible contact holes free of the resist material.

7. A process of manufacturing a semiconductor as recited in claim 6, wherein said applying step comprises applying a plurality of test patterns to a plurality of locations on the resist for insolating the resist at said plurality of regions.

8. In a process of manufacturing a semiconductor having a photoetching procedure for a resist layer and including application of a test pattern to the resist layer and developing of the test pattern, the improvement comprising:
    a method for determining whether any resist material remains at predetermined portions of the developed test pattern on the resist layer, comprising the steps of
    insolating the resist layer at a plurality of locations by a test pattern, each location being insolated at a different focussing setting;
    heating the resist layer having the developed test pattern thereon above a vitreous transition point thereof in order to cause the test pattern developed in the resist layer to flow and to increase a thickness of a thin layer of resist remaining at said predetermined portions of the test pattern developed on the resist layer;

observing by optic reflectometry a contrast between a first portion of the test pattern having resist material and one of the predetermined portions of the test pattern which are nominally free of resist material; and determining by the observed contrast whether resist material has been eliminated at the observed predetermined portion of the test pattern.

9. A process of determining an accurate focussing setting for a photolithographic procedure for a resist layer, comprising:

insolating the resist layer at a plurality of locations by a test pattern, each location being insolated at a different focussing setting;

developing the test pattern; and determining whether any resist material remains at predetermined portions of the developed test pattern on the resist layer, wherein said predetermined portions of the test pattern are nominally free of resist material;

said determining step comprising the further steps of:

heating the resist layer having the developed test pattern thereon above a vitreous transition point thereof in order to cause the developed test pattern to flow and to increase a thickness of a thin layer of resist remaining at any of said predetermined portions of the developed test pattern;

observing by optical reflectometry a contrast between a first portion of the test pattern having resist material and one of the predetermined portions of the test pattern nominally free of resist material; and determining by the observed contrast whether any resist material remains at the observed predetermined portion of the test pattern, whereby an optimal focussing setting is determined as the setting used for insolating the test pattern for a predetermined portion wherein no resist material is observed.

10. A process of determining an accurate focussing setting as recited in claim 9, wherein said insolating step comprises insolating said resist layer at said plurality of locations by successive incremental variations of said focussing setting, and comprising the further step of selecting as the optimal focussing setting the focussing setting for the first predetermined portion wherein resist material is not observed.

* * * * *